(12) United States Patent
Gaynor

(10) Patent No.: US 11,736,102 B1
(45) Date of Patent: Aug. 22, 2023

(54) RF SWITCH WITH IMPROVED ISOLATION AT TARGET FREQUENCIES

(71) Applicant: pSemi Corporation, San Diego, CA (US)

(72) Inventor: Michael P. Gaynor, Crystal Lake, IL (US)

(73) Assignee: PSEMI CORPORATION, San Diego, CA (US)

( * ) Notice: Subject to any disclaimer, the term of this patent is extended or adjusted under 35 U.S.C. 154(b) by 0 days.

(21) Appl. No.: 17/577,610

(22) Filed: Jan. 18, 2022

(51) Int. Cl.
  *H03K 17/00* (2006.01)
  *H03K 17/16* (2006.01)
  *H03K 17/687* (2006.01)

(52) U.S. Cl.
  CPC ......... *H03K 17/161* (2013.01); *H03K 17/687* (2013.01)

(58) Field of Classification Search
  CPC .......................... H03K 17/161; H03K 17/687
  See application file for complete search history.

(56) References Cited

U.S. PATENT DOCUMENTS

| | | | | |
|---|---|---|---|---|
| 4,789,846 A * | 12/1988 | Matsunaga | ............... | H01P 1/15 333/247 |
| 5,039,873 A * | 8/1991 | Sasaki | .................. | H03K 17/693 327/586 |
| 6,496,684 B2 * | 12/2002 | Nakao | .................. | H03K 17/687 455/73 |
| 6,693,498 B1 * | 2/2004 | Sasabata | ............... | H03K 17/693 333/262 |
| 7,812,689 B2 * | 10/2010 | Atsumo | .................. | H01P 1/185 333/139 |

(Continued)

FOREIGN PATENT DOCUMENTS

| JP | 7-303001 | * | 11/1996 |
| JP | 9-8501 | * | 1/1997 |
| KR | 101823269 B1 | | 1/2018 |

OTHER PUBLICATIONS

Lim, Chin-Leong, Avego Technologies, "Design a PIN diode switch for high-linearity applications." EE Times. Aug. 11, 2008. 13 pages. Downloaded on Oct. 18, 2021. From Internet: eetimes.com/design-a-pin-diode-switch-for-high-linearity-applications/#.

(Continued)

*Primary Examiner* — Tuan T Lam
(74) *Attorney, Agent, or Firm* — Steinfl + Bruno LLP

(57) ABSTRACT

A compact RF switch with improved isolation is presented. According to one aspect, the RF switch includes a basic single-pole single-throw (SPST) switch element that includes an inductor in parallel with a series FET transistor. An inductance of the inductor is selected to provide in combination with an off capacitance of the series FET transistor a resonance at a specific frequency of interest. The frequency of interest can be in-band or out-of-band, including the band's fundamental frequency or a harmonic thereof. According to another aspect, the inductor is conditionally coupled to the series FET transistor via a reduced size FET transistor. Complex RF switches can include a plurality of the SPST switch elements, each tuned to a same or different frequency of interest. According to yet another aspect, SPST switch elements in their OFF states can provide matching to an SPST element in the ON state.

17 Claims, 13 Drawing Sheets

(56) References Cited

U.S. PATENT DOCUMENTS

| | | | |
|---|---|---|---|
| 2005/0093026 A1* | 5/2005 | Sagae | H01P 1/15 257/213 |
| 2009/0029654 A1* | 1/2009 | Fu | H04B 1/48 455/83 |
| 2009/0051464 A1* | 2/2009 | Atsumo | H03H 11/16 333/139 |
| 2011/0227637 A1 | 9/2011 | Stuber et al. | |
| 2015/0054594 A1 | 2/2015 | Apriyana et al. | |
| 2016/0020816 A1* | 1/2016 | Lee | H03K 17/161 455/78 |
| 2016/0182037 A1* | 6/2016 | Srihari | H03K 17/687 343/858 |
| 2020/0153428 A1 | 5/2020 | Popplewell et al. | |
| 2021/0099169 A1 | 4/2021 | Reedy et al. | |

OTHER PUBLICATIONS

International Search Report and Written Opinion for international application No. PCT/US2022/081841 filed on Dec. 16, 2022 on behalf of Psemi Corporation, dated Apr. 28, 2023. 13 pages.

* cited by examiner

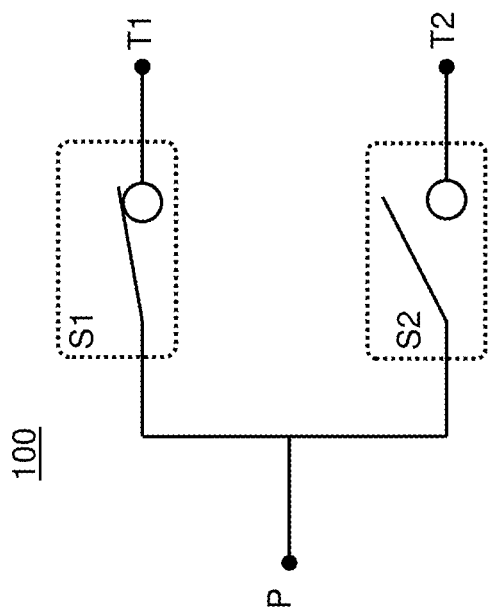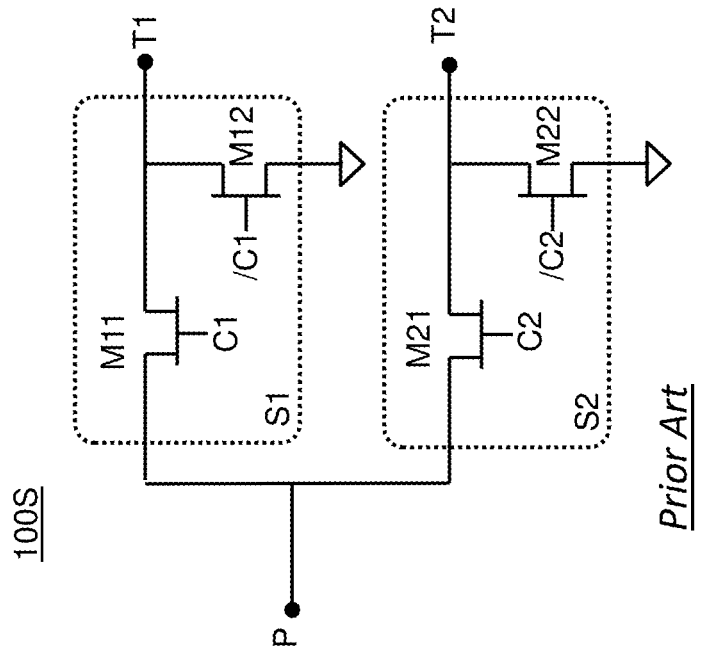
FIG. 1C *Prior Art*

RF SWITCH WITH IMPROVED ISOLATION AT TARGET FREQUENCIES

TECHNICAL FIELD

The present disclosure is related to electronic radio frequency (RF) circuits, and more particularly to RF switches with improved isolation at target frequencies of interest.

BACKGROUND

Processing of an RF signal in an RF system may be provided via a combination of (RF) switches that selectively route the RF signal through one or more RF paths. Such switches may be designed to provide an RF performance suitable for processing of the RF signal in a specific frequency band of operation, or across different frequency bands of operation. One important RF performance metric of an RF switch is a level of isolation provided between a common port (e.g., pole) of the switch and a deactivated throw of the switch. Such level of isolation determines a level of RF signal leakage that may couple between the common port and the deactivated port through the RF switch. In some implementations it may be necessary to maintain such RF signal leakage to within a predetermined level, as higher levels may negatively impact performance of the RF system, and in some cases damage system components and/or violate regulatory requirements.

FIG. 1A shows a block diagram of a single-pole dual-throw switch (100, SPDT), wherein a common port P serves as the pole of the switch that can selectively be coupled to either a first port, T1, or a second port, T2, the first and second ports, T1 and T2, serving as throws of the switch (100). As can be seen in FIG. 1A, the SPDT switch (100) may include two single-pole single throw (SPST) switches, S1 and S2, each configured to selectively couple the common port, P, to a respective port, T1 or T2. In other words, a simple SPST (e.g., S1 or S2) switch can be used as a basic RF switch element of a more complex switch (e.g., SPDT 100). This is shown in the prior art single-pole multiple-throws (antenna) switch (110, SPMT) of FIG. 1B, wherein a plurality of SPST switches (S1, S2, ..., Sn) are used to selectively couple an RF path coupled at a respective port (TRX1, TRX2, ..., TRXn) to an antenna, ANT, that is coupled to the common port, P. For example, as shown in FIG. 1B, the first SPST switch, S1, may be closed (e.g., activated) to provide a (low impedance) conduction path between the port TRX1 and the common port, P, and remaining SPST switches (S2, ..., Sn) may be open (e.g., deactivated) to provide respective isolated paths between the ports (TRX2, ..., TRXn) and the common port, P. It should be noted that the RF path coupled at the respective port (TRX1, TRX2, ..., TRXn) may be an RF transmit path (to the antenna), an RF receive path (from the antenna), or an RF transmit and receive path (to and from the antenna). Furthermore, it should be noted that the switch topology shown in FIG. 1B may also be referred to as a 1:n multiplexer, as it allows selective connection/coupling of one input (at port P) to n outputs (at ports TR1, ..., TRXn) or vice versa.

A level of isolation provided by an RF switch may be based on the design of the switch. For example, as shown in FIG. 1C, the basic RF switch element (e.g., S1, S2) of the SPDT switch (100) may be realized via FET transistor switches according to a well-known in the art RF switch topology (100S). In such topology, FET transistors in series (e.g., M11, M21) and shunting (e.g., M12, M22 coupled at one node/terminal to a reference ground) configurations are used to provide a desired level of isolation between the pole (e.g., P) and the throw (e.g., T1, T2) of the switch. For example, considering the basic RF switch element S1 of the switch topology (100S), when the switch S1 is deactivated, isolation (high impedance path) between ports P and T1 is provided via an OFF condition/state (e.g., OFF device capacitance) of the series FET transistor, M11, combined with an ON condition/state (e.g., low ON resistance) of the shunting FET transistor, M12. On the other hand, when the switch S1 is activated, conduction (low impedance path) between ports P and T1 is provided via an ON condition/state (e.g., low ON resistance) of the series FET transistor, M11, combined with an OFF condition/state (e.g., OFF device capacitance) of the shunting FET transistor, M12. Activation and deactivation of the switches S1 and S2 used in the SPDT topology (100S) may be provided via control signals (C1, C2) and respective complementary counterparts (/C1, /C2) as shown in FIG. 1C. It should be noted that in some implementations of the SPDT switch (100S), C2 may be equal to, or based on, /C1 (likewise C1 may be equal to or based on /C2.

A level of isolation provided by the basic RF switch element, S1, as used for example in the SPDT topology (100S) of FIG. 1C is shown in a corresponding graph (600, S1) of FIG. 6. As shown in the graph, such level of isolation within a frequency band of operation, B1, that is centered at about 2.25 GHz, is about −55 dB. In some applications such level of isolation may not be sufficient. Traditional prior art implementations may further increase/improve isolation via added (FET) stages to the basic RF switch element, S1. For example, as shown in FIG. 1D, a series FET, M13, may be added/cascaded to the basic RF switch element (S1, left side of FIG. 1D) to obtain the basic RF switch element, S'1, shown in the right side of FIG. 1D. When the switch, S'1, is deactivated, the OFF condition/state (e.g., OFF capacitance) of the FET, M13, may further increase (by about 25 dB) isolation between ports P and T1 as shown in a corresponding graph (600, S'1) of FIG. 6.

Prior art solutions provided by increasing number of stages (series or shunting FET switches) as described above with reference to FIG. 1D may deteriorate insertion loss performance of the switch and increase physical footprint (die area) of the switch. Other prior art approaches may overcome such deterioration of the insertion loss by using different design techniques that include pin diodes (two-terminal device) combined with quarter wavelength transmission lines and/or inductors to provide RF switching functionality between ports (e.g., antenna and RF paths) with increased isolation performance only at a specific frequency band of operation. However, such approaches require either large physical footprints that may become prohibitively costly for large number of throws, and/or are not able to achieve isolation performance at frequencies that are outside the frequency band of operation of the RF signal being processed.

The above shortcomings of the prior art are a motivation to the present teachings which aim for an improved isolation performance of a compact RF switch that can be targeted to any frequency of interest, including a frequency within a frequency band of operation (in-band) or outside such band of operation (out-of-band).

SUMMARY

According to a first aspect of the present disclosure, a radio frequency (RF) switch is presented, comprising: a first single-pole single-throw (SPST) switch element coupled between a common port of the RF switch and a first port of the RF switch, the first SPST switch element comprising: a first series transistor coupled between the common port and the first port; a first shunting transistor coupled between the first port and a reference ground; and an first inductor coupled between the common port and the first port.

According to a second aspect of the present disclosure, a method for improving isolation performance of a radio frequency (RF) switch at a frequency of interest is presented, the method comprising: realizing the RF switch via at least on single-pole single-throw (SPST) switch comprising: a first series transistor coupled between a common port a first port of the RF switch; and a first shunting transistor coupled between the first port and a reference ground; based on the realizing, determining an off capacitance of the first series transistor; based on the determining, selecting an inductor having an inductance that when combined in parallel with the off capacitance, realizes a resonant circuit that resonates at the frequency of interest; and based on the selecting, coupling the inductor between the common port and the first port, thereby improving isolation performance of the RF switch at the frequency of interest.

Further aspects of the disclosure are provided in the description, drawings and claims of the present application.

BRIEF DESCRIPTION OF THE DRAWINGS

The accompanying drawings, which are incorporated into and constitute a part of this specification, illustrate one or more embodiments of the present disclosure and, together with the description of example embodiments, serve to explain the principles and implementations of the disclosure.

FIG. 1C shows a simplified schematic of an SPDT RF switch realized via a basic RF switch element comprising FET transistor switches.

Like reference numbers and designations in the various drawings indicate like elements.

DETAILED DESCRIPTION

As used in the present disclosure, the term "band" can refer to a frequency range. More in particular, the term "band" as used herein refers to a frequency range that can be defined by a wireless standard such as, but not limited to, wideband code division multiple access (WCDMA), long-term evolution (LTE) and 5G new radio (NR).

As used in the present disclosure, the term "channel" can refer to a frequency range. More in particular, the term "channel" as used herein refers to a frequency range within a band. As such, a band can comprise several channels used to transmit/receive a same wireless standard.

Figure 1B:
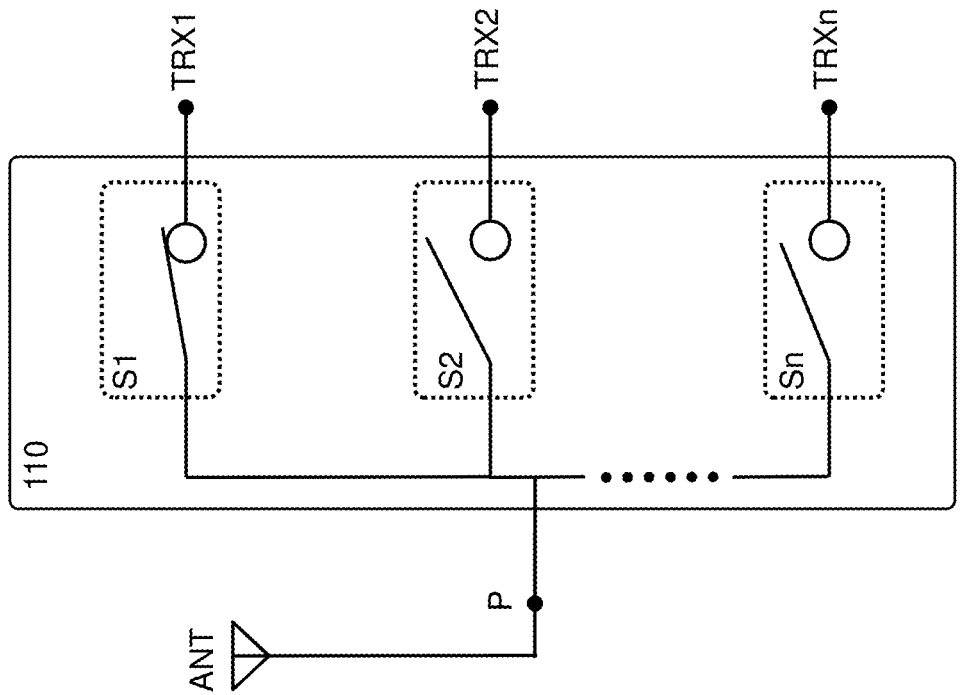
FIG. 1B shows a simplified block diagram of an RF system comprising a plurality of RF paths coupled to an antenna through a single-pole multi-throw (SPMT) RF switch.
Figure 1A:
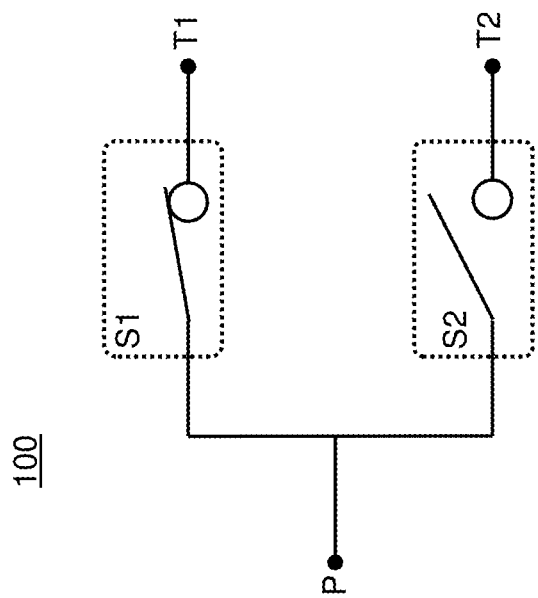
FIG. 1A shows a block diagram of a single-pole dual-throw (SPDT) RF switch.
Figure 1D:
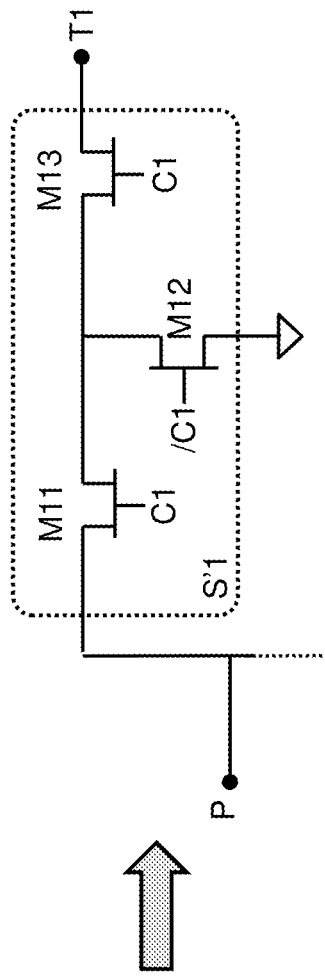
FIG. 1D shows a simplified schematic of a basic RF switch element with improved isolation performance.
Figure 1D:
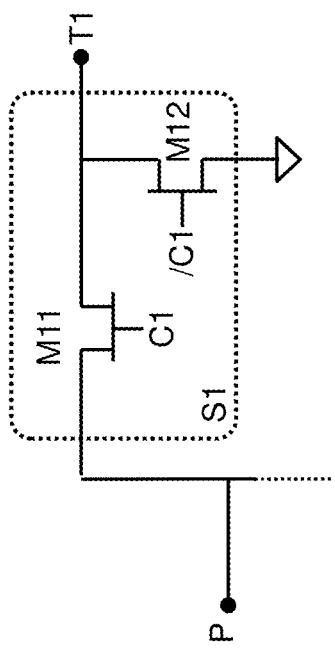
Figure 2B:
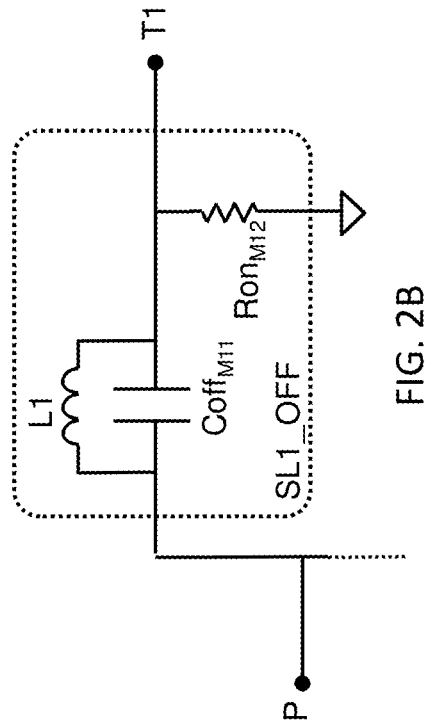
FIG. 2B shows an equivalent OFF state representation of the basic RF switch element of FIG. 2A.
Figure 2C:
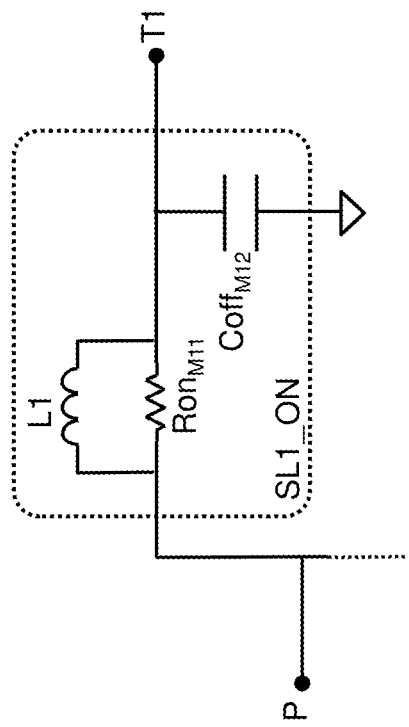
FIG. 2C shows an equivalent ON state representation of the basic RF switch element of FIG. 2A.
Figure 2A:
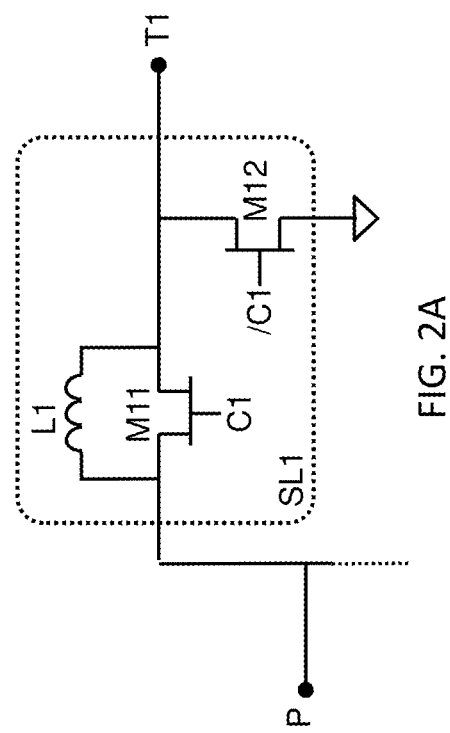
FIG. 2A shows a simplified schematic of a basic RF switch element according to an embodiment of the present disclosure.

FIG. 2A shows a simplified schematic of a basic RF switch element, SL1, according to an embodiment of the present disclosure. When compared to the prior art basic RF switch element (e.g., S1 or S2 of FIG. 1C), the basic RF (SPST) switch element, SL1, is distinguished by inclusion of an inductor, L1, that is coupled across the series FET transistor (switch), M11. In other words, the first and second terminals of the inductor, L1, are (interchangeably) coupled/connected to the drain and source terminals/nodes of the transistor M11.

As shown in FIG. 2B, when the basic RF switch element, SL1, is deactivated (i.e., OFF state/condition), the equivalent OFF capacitance, $Coff_{M11}$, of the series FET transistor, M11, in combination with the inductor, L1, provide a resonant circuit with a resonance at a frequency that depends on an inductance of the inductor, L1. In other words, the inductance of the inductor, L1, may be selected such that the parallel combination of the equivalent OFF capacitance, $Coff_{M11}$, of the series FET transistor, M11, with the inductance of the inductor, L1, resonate at a specific (target) frequency. Such resonant effect in the OFF state of the basic RF switch element, SL1, generates a peak in an impedance presented between the two ports (P and T1) of the element, SL1, that is centered about the resonance frequency. In turn, as shown in a corresponding graph (600, SL1) of FIG. 6, such peak in impedance generates an isolation notch about the resonance frequency (e.g., $f_1$ of FIG. 6). It should be noted the equivalent ON resistance, $Ron_{M12}$, of the shunting FET transistor, M12, may have a negligeable effect on a response of the resonant circuit.

Figure 6:
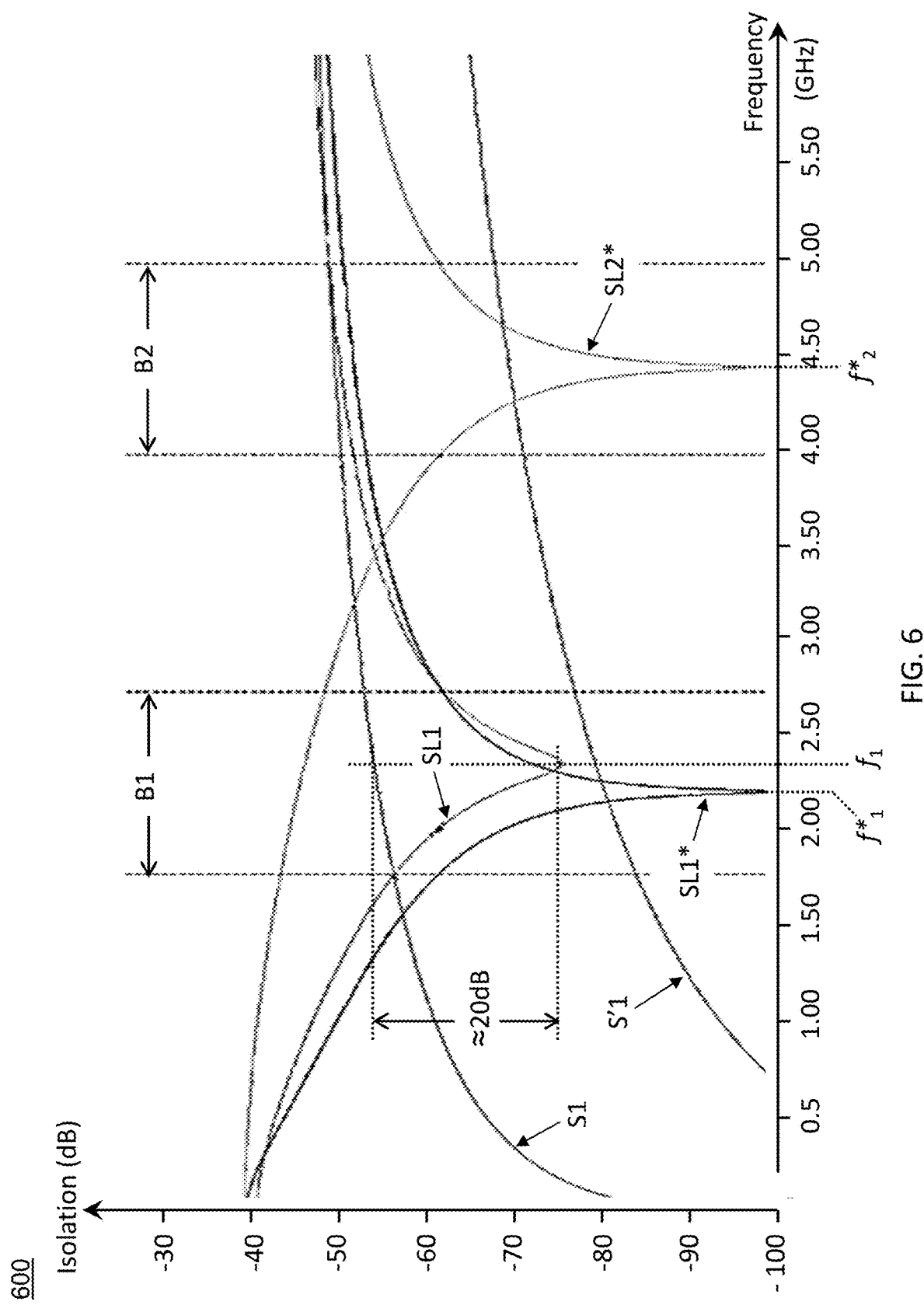
FIG. 6 shows graphs representative of isolation performance of the basic RF switch element according to the present disclosure contrasted to the prior art implementations.

As shown in the graph (600, SL1) of FIG. 6, the level of isolation at the resonance frequency, $f_1$, which is within the frequency band of operation, B1, is about −75 dB, which represents about 20 dB improvement in isolation when compared to the attenuation performance of the prior art basic RF switch element, L1, at the same frequency (e.g., graph 600, S1 of FIG. 6). It should be noted that teachings according to the present disclosure allow for tuning of the resonance frequency, $f_1$, to any target/specific frequency of interest, whether in-band (e.g., B1 of FIG. 6) or out-of-band (e.g., B2 of FIG. 6).

For example, FIG. 6 shows graphs labelled SL1* and SL2* which correspond to different target frequencies obtained via different inductances (e.g., of the inductor L1 of FIG. 2A), including $f^*_1$ and $f^*_2$ which may respectively correspond to the center/fundamental frequency of the frequency band, B1, and its second harmonic. It should be noted that the graphs labelled SL1* and SL2* of FIG. 6 show isolation notches provided by ideal inductors (only inductance and no parasitic resistance) and are therefore of higher magnitude when compared to the isolation notch provided by the graph labelled SL1 (which corresponds to an actual non-ideal inductor).

With further reference to FIG. 6, according to some embodiments of the present disclosure, targeting the second harmonic, $f^*_2$, of a center/fundamental frequency, $f^*_1$, of a frequency band of operation, B1, via an isolation notch (centered at $f^*_2$) provided by the resonant effect of the present teachings, may allow attenuation of undesired intermodulation products that may negatively affect linearity performance of an RF signal being processed through an RF switch. A person skilled in the art will appreciate the flexibility provided by the present teachings in tuning the isolation notch to any specific frequency of interest which may be used, for example, to eliminate cross coupling of undesired frequency components between the various RF (transmit and/or receive) paths of an RF system (e.g., RF frontend system).

FIG. 2C shows an equivalent ON state representation of the basic RF switch element, SL1, of FIG. 2A. As shown in FIG. 2C, when the basic RF switch element, SL1, is activated (i.e., ON state/condition), the equivalent ON resistance, $Ron_{M11}$, of the series FET transistor, M11, in combination with the equivalent OFF capacitance, $Coff_{M12}$, of the shunting FET transistor, M12, may provide a low impedance conduction path between the two ports (P and T1) of the element, SL1. In other words, an impedance of the basic RF switch element, SL1, in the ON state may be dominated by $Ron_{M11}$ as impedances of L1 and $Coff_{M12}$ are (very) high (e.g., open circuit) at the frequency band of operation.

Figure 3B:
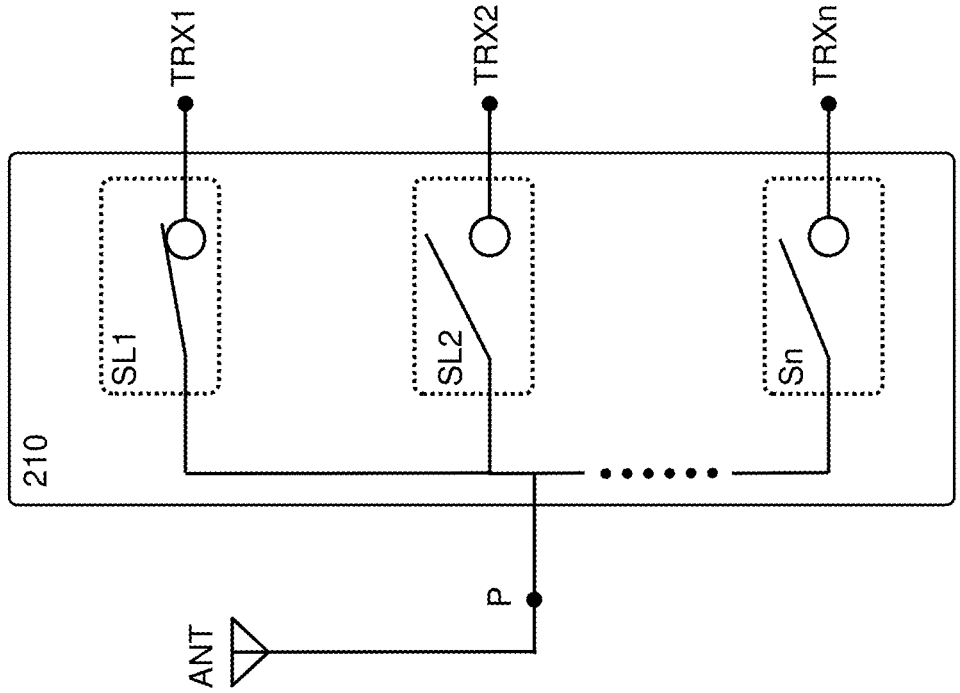
FIG. 3B shows a simplified block diagram of an RF system comprising a plurality of RF paths coupled to an antenna through a single-pole multi-throw (SPMT) RF switch realized via the basic RF switch element of FIG. 2A.
Figure 3A:
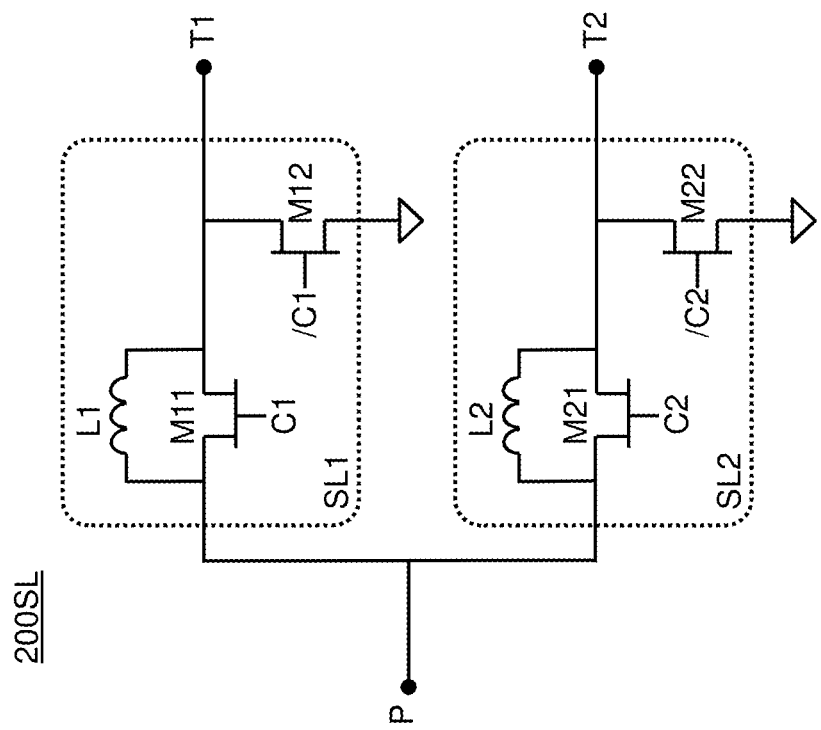
FIG. 3A shows a simplified schematic of an SPDT RF switch realized via the basic RF switch element of FIG. 2A.

FIG. 3A shows a simplified schematic of an SPDT RF switch, (200SL), realized via the basic RF switch element, SL1, of FIG. 2A. In this case, two such basic RF switch elements (SL1, SL2) are used to provide functionality of the SPDT RF switch, (200SL), wherein corresponding elements of the basic RF switch elements (SL1, SL2) are annotated with a corresponding reference numeral prefix (e.g., 1 or 2). As previously described, each of the corresponding resonant circuits (e.g., M11, L1 or M21, L1) may provide attenuation notches centered at a same or different frequency. For example, the combination of (M11, L1) of SL1 may provide an attenuation notch at a center frequency (or harmonic) of an RF channel (or band) processed through an RF path coupled to the port, T2, and the combination of (M21, L2) of SL2 may provide an attenuation notch at a center frequency (or harmonic) of an RF channel (or band) processed through an RF path coupled to the port, T1. As another example, the combination of (M11, L1) of SL1 and of (M21, L2) of SL2 may target a same frequency of interest that may be either in-band or out-of-band with respect to the frequency band of operation of the respective RF channels processed through the ports T1 and T2.

FIG. 3B shows a simplified block diagram of an RF system comprising a plurality of RF paths coupled to an antenna, ANT, through a single-pole multi-throw (210, SPMT) RF switch realized via the basic RF switch element, SL1, of FIG. 2A. Therefore, according to the above description, an improvement in isolation performance of the SPMT RF switch (210) can be provided in view of the inclusion of at least one RF switch element, SL1, according to the present teachings. In the exemplary case shown in FIG. 3B, two such elements, SL1 and SL2, are shown, as well as a traditional element (e.g., Sn according to FIGS. 1B and 1C). Teachings according to the present disclosure allow design and implementation of complex switches, including SPDT and SPMT described above, as well as more complex switches, including multi-pole and multi-throw switches, using a plurality of basic (SPST) RF switch elements that include one or more of the RF switch elements according to the present disclosure (e.g., SL1 of FIG. 2A). In other words, isolation performance benefits of a complex RF switch may be provided with partial or exclusive use of the RF switch elements according to the present disclosure.

Figure 4B:
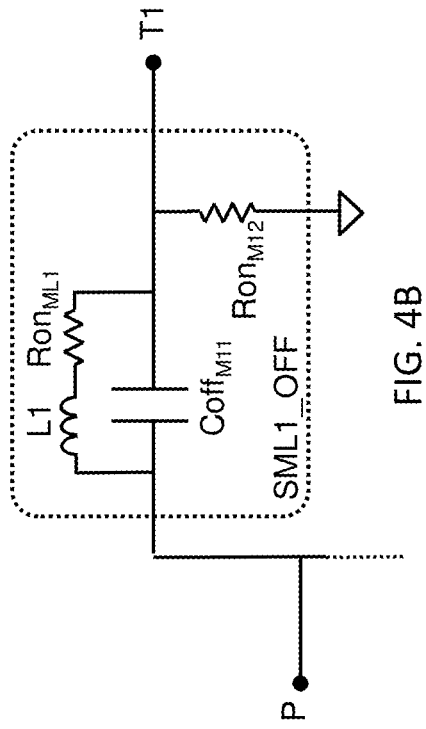
FIG. 4B shows an equivalent OFF state representation of the basic RF switch element of FIG. 4A.
Figure 4C:
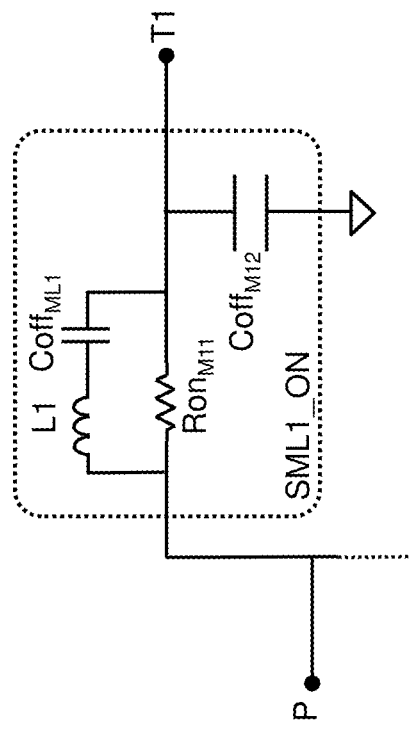
FIG. 4C shows an equivalent ON state representation of the basic RF switch element of FIG. 4A.
Figure 4A:
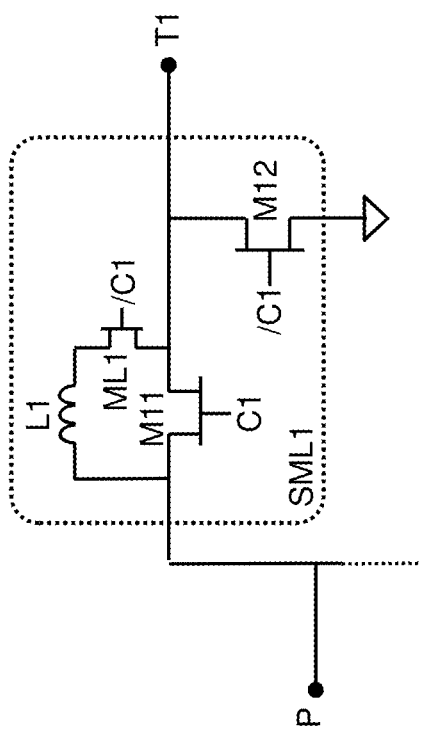
FIG. 4A shows a simplified schematic of another basic RF switch element according to an embodiment of the present disclosure.

FIG. 4A shows a simplified schematic of another basic RF switch element, SML1, according to an embodiment of the present disclosure. In such embodiment (parallel) coupling of the inductor, L1, to the series FET transistor, M11, may be conditional/selectable via inclusion of a series switch, ML1. According to an embodiment of the present disclosure, the series switch may be a FET transistor, ML1, that may be controlled (i.e., ON/OFF) via the control signal, /C1. In other words, when /C1 is true, ML1 is ON to provide a low impedance path to the inductor, L1, to the series FET transistor, M11. This allows to conditionally/selectively couple (in parallel) the inductor, L1, to the series FET transistor, M11, during the OFF state (e.g., SML1_OFF shown in FIG. 4B) of the basic RF switch element, SML1, to provide the resonant circuit/effect described above with reference to FIG. 2A and FIG. 2B. On the other hand, during the ON state (e.g., SML1_ON shown in FIG. 4C) of the basic RF switch element, SL1, the inductor, L1, is not connected in parallel to the series FET transistor, M11, and no current is conducted through the inductor since the inductor, L1, is effectively taken out of the circuit.

FIG. 4B shows an equivalent OFF state, SML1_OFF, representation of the basic RF switch element, SML1, of FIG. 4A. In this case the series switch, ML1, is ON and represented by its equivalent ON resistance, $Ron_{ML1}$, which provides a low impedance conduction path to connect the inductor, L1, in parallel with the equivalent OFF capacitance, $Coff_{M11}$, of the series FET transistor, M11, thereby closing the parallel (resonant) circuit (L1, $Coff_{M11}$). It should be noted that the equivalent ON resistance, $Ron_{ML1}$, may have negligeable effect on a response of the resonant circuit, and therefore, isolation performance (e.g., magnitude of corresponding isolation notch) provided by SML1 may be similar to one provided by SL1 described above with reference to FIGS. 2A-2C.

FIG. 4C shows an equivalent ON state representation, SML1_ON, of the basic RF switch element, SML1, of FIG. 4A. In this case the series switch, ML1, is OFF and represented by its equivalent OFF capacitance, $Coff_{ML1}$, which provides a high impedance conduction path that disconnects inductor, L1, and the equivalent ON resistance, $Ron_{M11}$, of the series FET transistor, M11, thereby effectively decoupling the inductor from the circuit. It should be noted that the equivalent OFF capacitance, $Coff_{ML1}$, may have negligeable effect on an RF performance of SML1 when activated (conducting). In other words, when activated, the basic RF switch elements SML1 and SL1 may provide similar RF performances (e.g., insertion loss, linearity, etc.).

Figure 7:
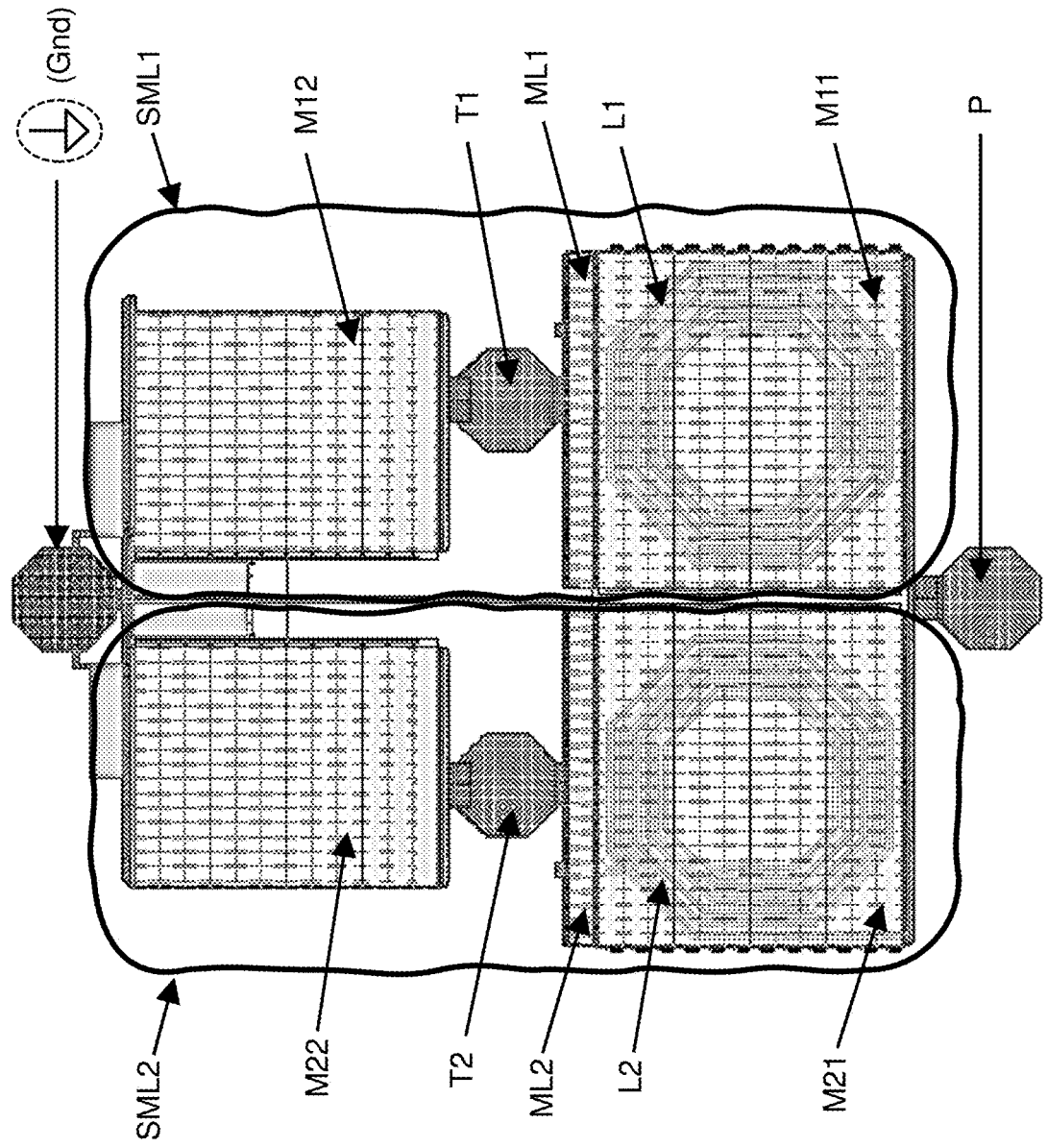
FIG. 7 shows a physical layout of the SPDT RF switch of FIG. 5A.

With reference back to FIG. 4A, according to an embodiment of the present disclosure, a size (e.g., width, length) of the series FET transistor (switch), ML1, may be smaller than a size of the series FET transistor, M11, and of the shunting FET transistor, M12. Such reduced size of the series FET transistor (switch), ML1, may allow maintaining of a small footprint of a physical layout of the basic RF switch element, SML1, as shown in FIG. 7 (later described). According to an exemplary embodiment of the present disclosure, a ratio between the size of ML1 and a size of M11 (or M12) may be about 1/10. According to an exemplary embodiment of the present disclosure, such ratio may be within a range from 1/5 to 1/20 or even smaller, such as down to 1/1000. It should be noted that such reduced size of the series FET transistor, ML1, may be possible since during operation of the basic RF switch element, SML1, the series FET transistor, ML1, is not subjected to high voltage drops: when ML1 is ON, the voltage across its drain to source is small with the inductor seeing the RF voltage drop across ports (P, T1), and when ML1 is OFF, M11 is ON and very little voltage drop across ports (P, T1) is present. A person skilled in the art would know that relative size of two transistors may be based on any one or more of, for example, a gate width (Wg), a gate length (Lg), a stack height, a total die area or a total gate periphery of each device. In some embodiments where each transistor is implemented via a series stack of basic/elemental devices, the size of the transistor may be based on a number of individual basic/elemental devices in the series stack, known as stack height.

Figure 5B:
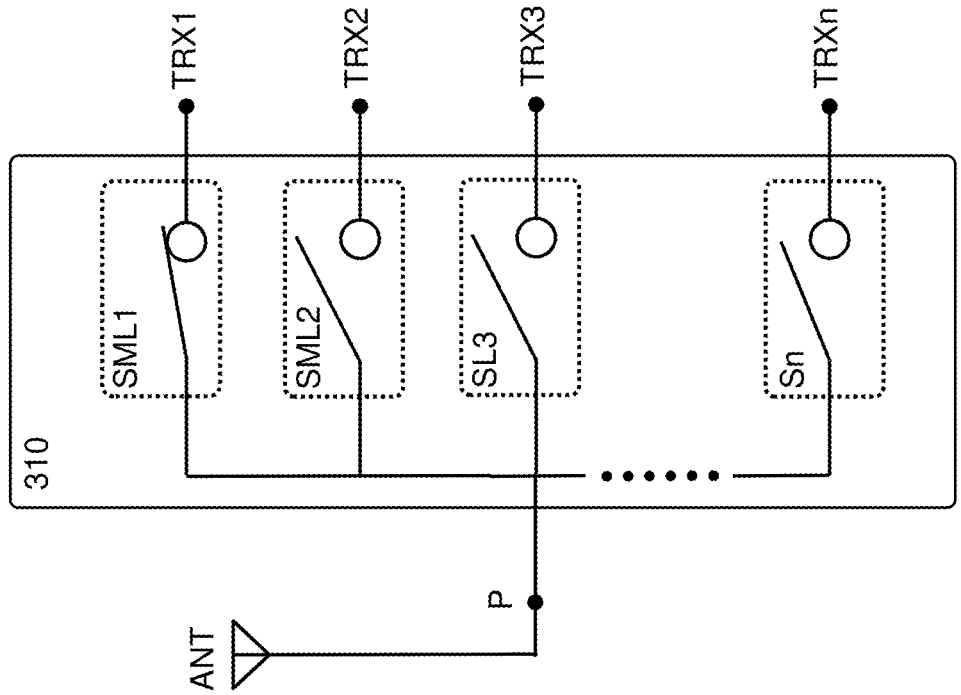
FIG. 5B shows a simplified block diagram of an RF system comprising a plurality of RF paths coupled to an antenna through a single-pole multi-throw (SPMT) RF switch realized via the basic RF switch element of FIG. 4A.
Figure 5A:
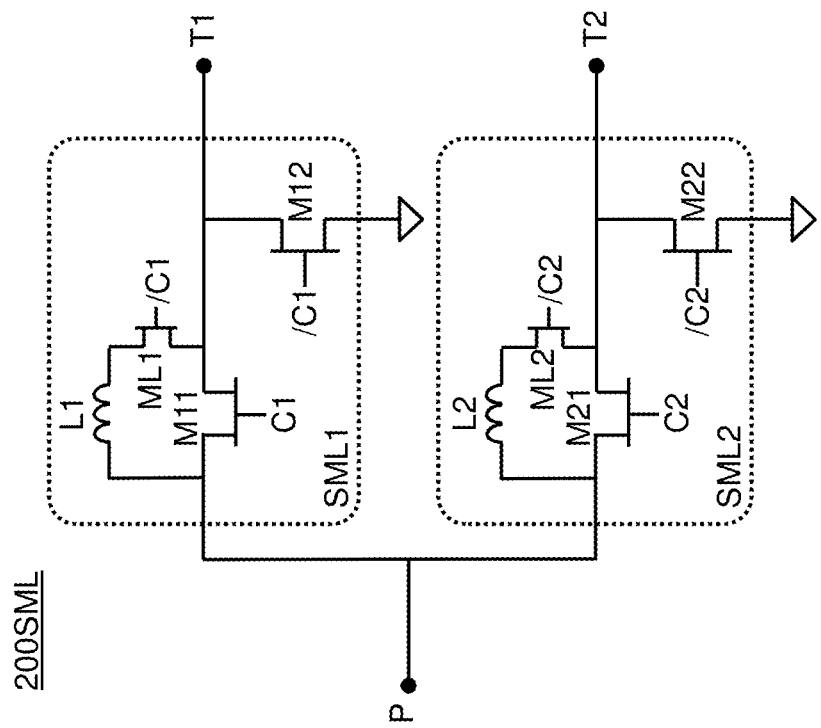
FIG. 5A shows a simplified schematic of an SPDT RF switch realized via the basic RF switch element of FIG. 4A.

FIG. 5A shows a simplified schematic of an SPDT RF switch, (200SML), realized via the basic RF switch element, SML1, of FIG. 4A. In this case, two such basic RF switch elements (SML1, SML2) are used to provide functionality of the SPDT RF switch, (200SML), wherein corresponding elements of the basic RF switch elements (SML1, SML2) are annotated with a corresponding reference numeral prefix (e.g., 1 or 2). Because RF performance during the ON and OFF states of each of the elements (SML1, SML2), including (a magnitude of the) attenuation notch provided via resonant effects, are similar to one described above with reference to each of the elements (SL1, SL2) of FIG. 3A, same description as provided above with reference to the SPDT RF switch (200SL) of FIG. 3A may apply to the SPDT RF switch, (200SML). On the other hand, and in addition, the selective switching in/out of the inductors (L1, L2) from the circuit (conduction path) provided by the configuration shown in FIG. 5A may allow to reduce RF coupling between the two elements (SML1, SML2) due to inductor radiation (e.g., mutual inductance). For example, when SML1 is activated (e.g., ON), the switch ML1 removes any conduction path through the inductor, L1, thereby reducing possible radiation to adjacent (in-circuit) inductor, L2, of the deactivated (e.g., OFF) SML2.

FIG. 5B shows a simplified block diagram of an RF system comprising a plurality of RF paths coupled to an antenna, ANT, through a single-pole multi-throw (310, SPMT) RF switch realized via the basic RF switch element, SML1, of FIG. 4A. Therefore, according to the above description, an improvement in isolation performance (as well as reduced radiation performance) of the SPMT RF switch (310) can be provided in view of the inclusion of at least one RF switch element, SML1, according to the present teachings. In the exemplary case shown in FIG. 5B, two such elements, SML1 and SML2, are shown, as well as an element, SL3, based on the configuration described above with reference to FIG. 2A, and a traditional/prior art element (e.g., Sn according to FIGS. 1B and 1C). Teachings according to the present disclosure allow design and implementation of complex switches, including SPDT and SPMT described above, as well as more complex switches, including multi-pole and multi-throw switches, using a plurality of basic (SPST) RF switch elements that include one or more of the RF switch elements according to the present disclosure (e.g., SL1 of FIG. 2A and/or SML1 of FIG. 4A). In other words, isolation performance benefits of a complex RF switch may be provided with partial or exclusive use of the RF switch elements according to the present disclosure, such as, for example, exclusive use of SML1 of FIG. 4A, or exclusive use of SL1 of FIG. 2A.

FIG. 6 shows graphs representative of isolation performance of the basic RF switch element (e.g., denoted SL1, SL1*, SL2*) according to the present disclosure contrasted to the prior art implementations (e.g., denoted S1, S'1). In particular FIG. 6 shows possible tuning of the resonance frequency (e.g., $f_1$, $f^*_1$, $f^*_2$) for different values of inductance used across the series FET transistor (e.g., M11, M21) of the basic RF switch element according to the present teachings. As previously described in the present disclosure, such resonance frequency may be tuned/selected to be in-band or out-of-band, including a harmonic (e.g., second harmonic, $f^*_2$) of a center/fundamental frequency (e.g., $f^*_2$) of a frequency band (e.g., B1) of operation of the RF system.

FIG. 7 shows a physical layout (700) of the SPDT RF switch, (200SML), of FIG. 5A. In particular, the physical layout (700) shows a symmetrical arrangement/layout of the two basic RF switch elements (SML1, SML2) of FIG. 5A, with a top region encompassing the shunting FET transistors (M12, M22) and a bottom region encompassing the series FET transistors (M11, M21), the inductors (L1, L2) and the reduced size series FET transistors (ML1, ML2). As shown in FIG. 7, compactness of the physical layout (700) may be attributed to the reduced size (e.g., ratio of about 1/10) of transistors (ML1, ML2) compared to the other transistors (e.g., M11, M21, M12, M22), as well as the layered construction of the inductors (L1, L2) via (metal) layers above the layers used to construct/fabricate the transistors (M11, M21). It should be noted that FIG. 7 shows one possible physical layout (700) of the SPDT RF switch, (200SML), of FIG. 5A, constructed for compactness, and therefore for reduced cost. Other physical layouts may be possible in view of different design goals and performances.

Figure 8A:
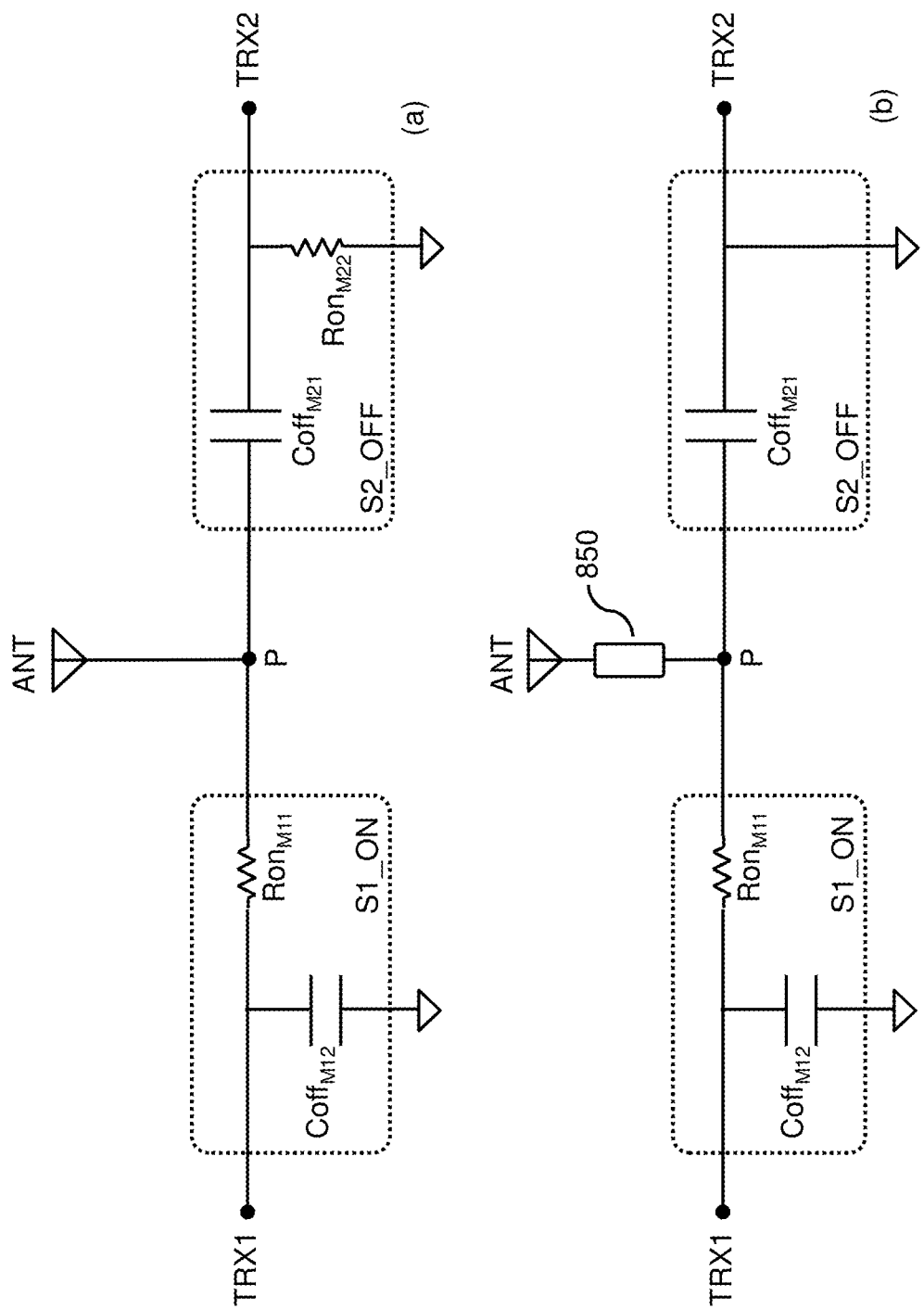
FIG. 8A shows an equivalent load at a common port of the prior art SPDT RF switch of FIG. 1C provided by a deactivated basic RF switch element of the prior art SPDT RF switch.

FIG. 8A shows an equivalent load (e.g., S2_OFF) at the common port, P, of the prior art SPDT RF switch (100S) of FIG. 1C provided by a deactivated basic RF switch element (e.g., S2) of the switch (100S). In particular, detail (a) shown in the top region of FIG. 8A, represents the equivalent impedances (S1_ON, S2_OFF) of the elements (S1, S2) of the prior art SPDT RF switch (100S) when coupled to an antenna, ANT. In such configuration, an RF conduction path provided by S1_ON, sees at the common port, P, an impedance of the antenna, ANT, combined with the equivalent impedance, S2_OFF. Because, at the frequency of operation, the ON resistance, $Ron_{M22}$, of S2_OFF may be negligible when compared to the impedance provided by the OFF capacitance, $Coff_{M21}$, of S2_OFF, the equivalent impedance, S2_OFF, may be approximated to, $Coff_{M21}$, as shown in detail (b) at the bottom region of FIG. 8A. Accordingly, the RF conduction path provided by S1_ON sees at the common port, P, the impedance of the antenna (e.g., 50 Ohms) combined with the impedance of, $Coff_{M21}$. However, at the frequency of operation of the RF system (e.g., frequency of an RF signal through the switch), the impedance of $Coff_{M21}$, is equal to 1/jw $Coff_{M21}$, and therefore is not negligible. Accordingly, usage of the prior art SPDT RF switch (100S) of FIG. 1C may require provision of a matching circuit (e.g., 850 shown in detail (b) of FIG. 8A) to translate the impedance seen at the common port, P, to a desired system impedance (e.g., 50 Ohms). It should be noted that such matching circuit (e.g., 850) may be coupled to the common port, P, as shown in FIG. 8A, or, in some cases, to the ports, TRX1 and/or TRX2 (not shown).

Figure 8B:
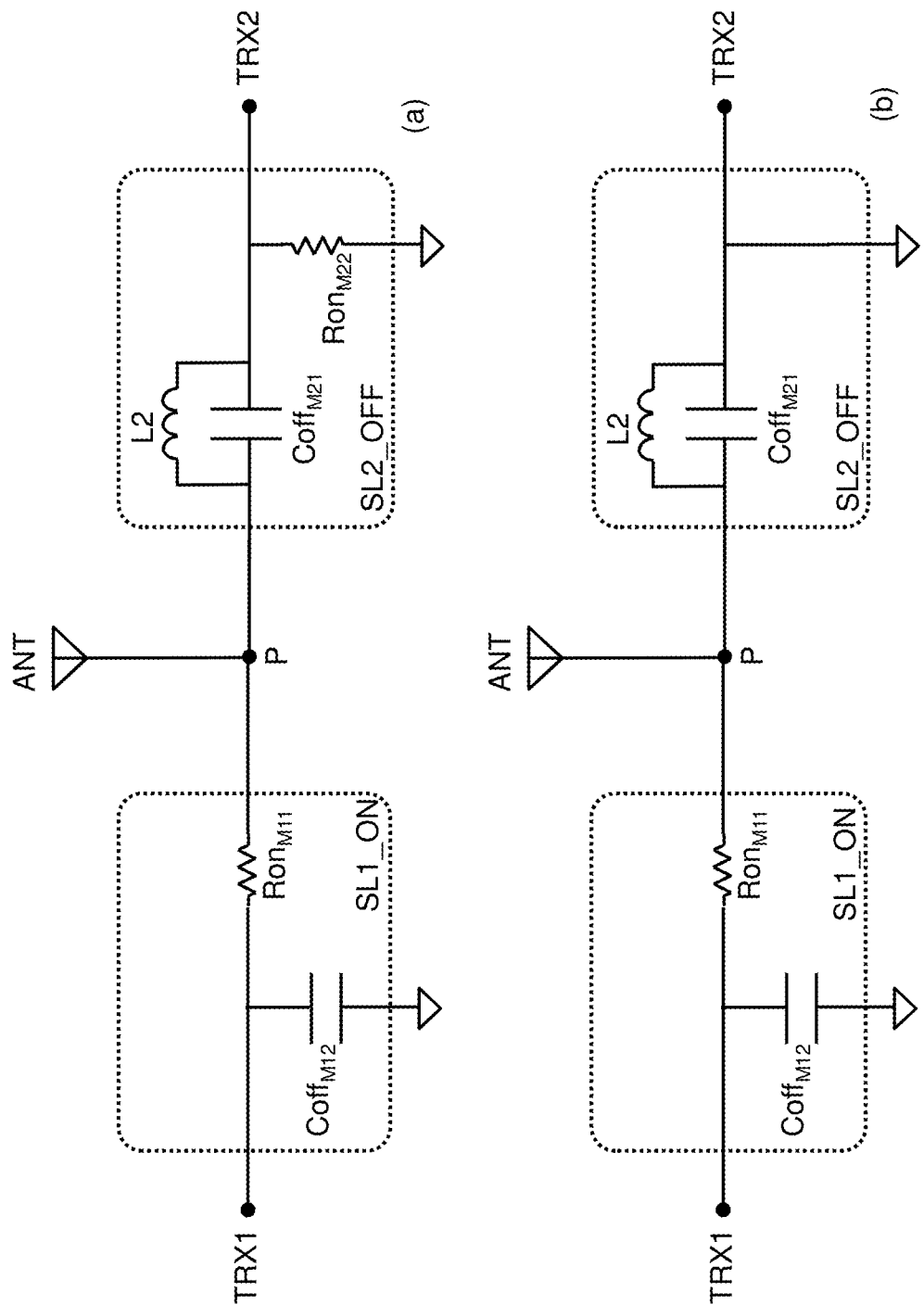
FIG. 8B shows an equivalent load at a common port of the SPDT RF switch of FIG. 3A provided by a deactivated basic RF switch element of the SPDT RF switch.

FIG. 8B shows an equivalent load (e.g., SL2_OFF) at the common port, P, of the SPDT RF switch (200SL) of FIG. 3A provided by a deactivated basic RF switch element (e.g., SL2) of the switch (200SL). In particular, detail (a) shown in the top region of FIG. 8B, represents the equivalent impedances (SL1_ON, SL2_OFF) of the elements (SL1, SL2) of the SPDT RF switch (200SL) according to the present teachings when coupled to an antenna, ANT. In such configuration, an RF conduction path provided by SL1_ON, sees at the common port, P, an impedance of the antenna, ANT, combined with the equivalent impedance, SL2_OFF. Because, at the frequency of operation, the ON resistance, $Ron_{M22}$, of SL2_OFF may be negligible when compared to the impedance provided by the resonant circuit (L2, $Coff_{M21}$) of S2_OFF, the equivalent impedance, SL2_OFF, may be approximated to the impedance provided by the resonant circuit (L2, $Coff_{M21}$) as shown in detail (b) at the bottom region of FIG. 8B. According to an embodiment of the present disclosure, the inductance of the inductor, L2, may be chosen to target resonance at the frequency of operation of an RF signal through the port TRX1. Accordingly, at such frequency of operation, the impedance provided by the resonant circuit (L2, $Coff_{M21}$) is very high and can be likened to an open circuit. In other words, at the frequency of operation, the RF conduction path provided by SL1_ON effectively sees at the common port, P, (only) the impedance of the antenna (e.g., 50 Ohms). This allows elimination of matching circuit (e.g., 850 of FIG. 8A) that may be required when using prior art RF switches (e.g., as described above with reference to FIG. 8A), as matching of an activated RF switch element (e.g., SL1_ON) may be provided by a deactivated basic RF switch element (e.g., SL2_OFF). Same performance in provision of an open circuit at the frequency of operation (or matching) can be provided by the SPDT RF switch (200SML) of FIG. 5A as effect of the equivalent ON resistance of the reduced size transistor (e.g., ML2 of FIG. 5A) over the provision of the open circuit is negligible. Furthermore, it should be noted that such matching to an activated basic RF switch element may be provided even in a more complex RF switch configuration according to the present disclosure, such as, for example, the SPMT RF switch (210) of FIG. 3B or (310) of FIG. 5B when configured with exclusive usage of the basic RF switch elements according to the present teachings (e.g., per FIG. 2A and/or FIG. 4A) and with the inductor tuned to the fundamental operating frequency.

Figure 8C:
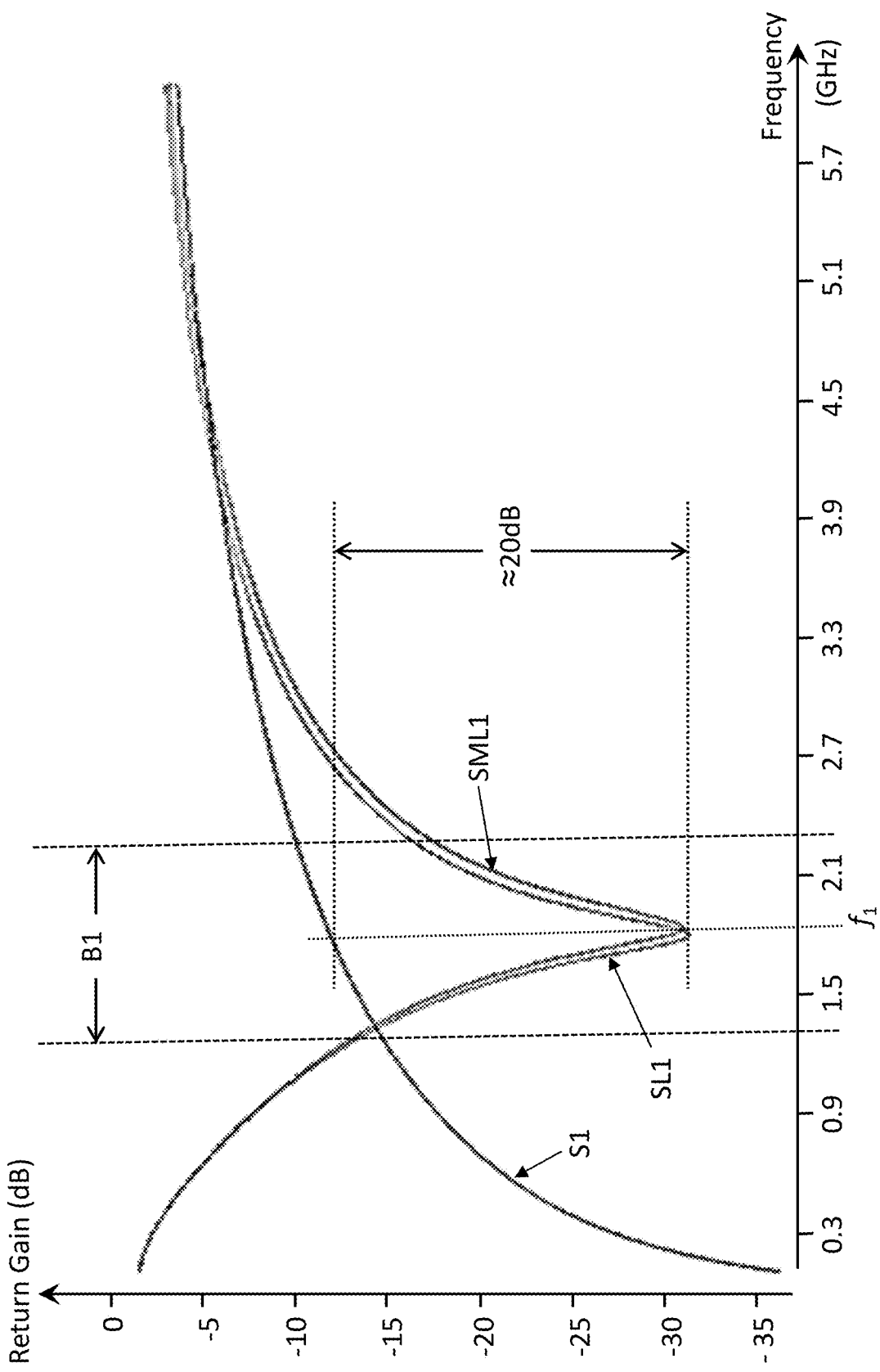
FIG. 8C shows graphs representative of return gain for the configurations represented in FIGS. 8A and 8B.

FIG. 8C shows graphs representative of return gain performance for the configurations represented in FIGS. 8A and 8B. As can be seen in FIG. 8C, at a frequency of operation, $f_1$, within an RF band of operation, B1, the matching provided by deactivated RF switch elements (e.g., SL2_OFF of FIG. 8B) to an activated RF switch element (e.g., SL1_ON of FIG. 8B) according to the present teachings (e.g., SL1 or SML1) substantially decreases/improves return gain (e.g., return loss, in dBs) when compared to the prior art configuration (e.g., S1) which instead modifies the system impedance to include an additionally coupled non-negligeable impedance at the frequency of operation, $f_1$, that results in loading down of the RF signal (e.g., at the common port, P) by about 20 dBs, unless an additional matching circuit is provided.

Figure 9:
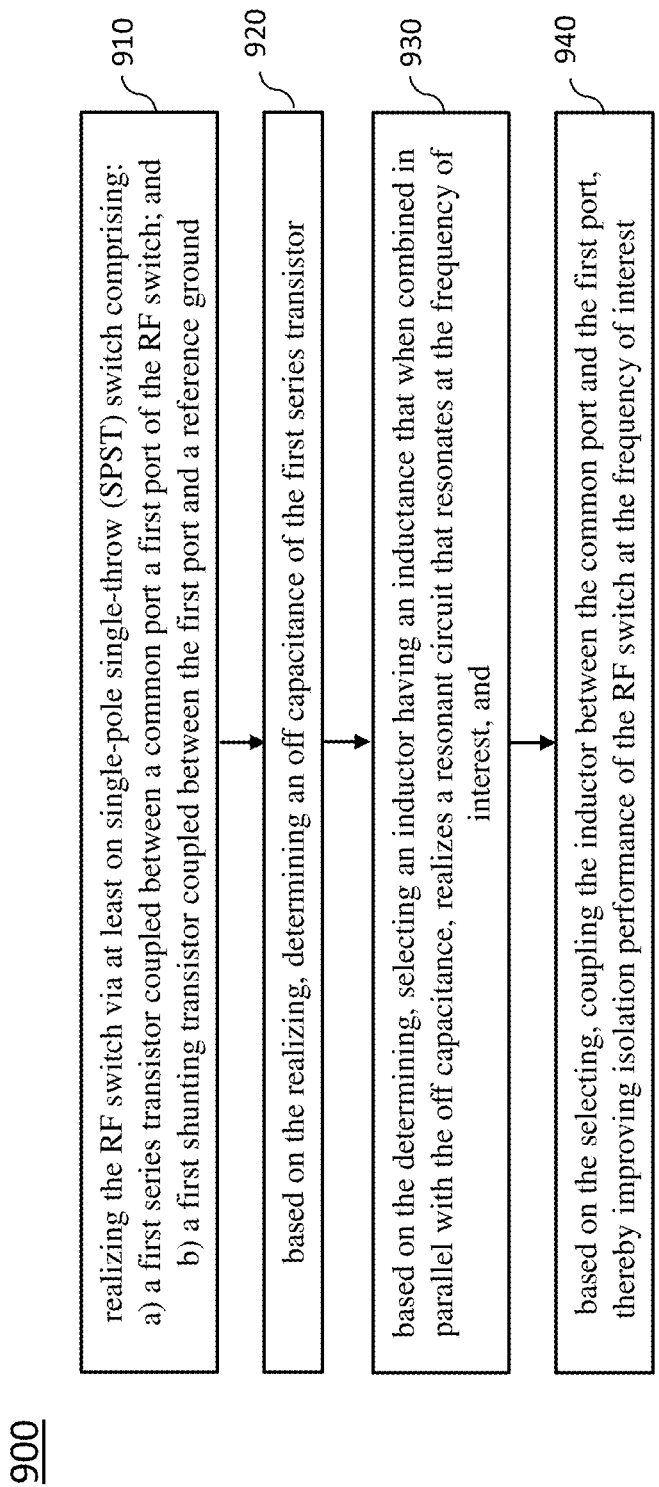
FIG. 9 is a process chart showing various steps of a method according to the present disclosure for improving isolation performance of a radio frequency (RF) switch at a frequency of interest.

FIG. 9 is a process chart (900) showing various steps of a method according to the present disclosure for improving isolation performance of a radio frequency (RF) switch at a frequency of interest. As shown in FIG. 9 such steps comprise: realizing the RF switch via at least on single-pole single-throw (SPST) switch comprising: a first series transistor coupled between a common port a first port of the RF switch; and a first shunting transistor coupled between the first port and a reference ground, per step (910); based on the realizing, determining an off capacitance of the first series transistor, per step (920); based on the determining, selecting an inductor having an inductance that when combined in parallel with the off capacitance, realizes a resonant circuit that resonates at the frequency of interest, per step (930); and based on the selecting, coupling the inductor between the common port and the first port, thereby improving isolation performance of the RF switch at the frequency of interest, per step (940).

The term "MOSFET", as used in this disclosure, includes any field effect transistor (FET) having an insulated gate whose voltage determines the conductivity of the transistor, and encompasses insulated gates having a metal or metal-like, insulator, and/or semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As used in this disclosure, the term "radio frequency" (RF) refers to a rate of oscillation in the range of about 3 kHz to about 300 GHz. This term also includes the frequencies used in wireless communication systems. An RF frequency may be the frequency of an electromagnetic wave or of an alternating voltage or current in a circuit.

Various embodiments of the invention can be implemented to meet a wide variety of specifications. Unless otherwise noted above, selection of suitable component values is a matter of design choice. Various embodiments of the invention may be implemented in any suitable integrated circuit (IC) technology (including but not limited to MOSFET structures), or in hybrid or discrete circuit forms. Integrated circuit embodiments may be fabricated using any suitable substrates and processes, including but not limited to standard bulk silicon, high-resistivity bulk CMOS, silicon-on-insulator (SOI), and silicon-on-sapphire (SOS). Unless otherwise noted above, embodiments of the invention may be implemented in other transistor technologies such as bipolar, BiCMOS, LDMOS, BCD, GaAs HBT, GaN HEMT, GaAs pHEMT, and MESFET technologies. However, embodiments of the invention are particularly useful when fabricated using an SOI or SOS based process, or when fabricated with processes having similar characteristics. Fabrication in CMOS using SOI or SOS processes enables circuits with low power consumption, the ability to withstand high power signals during operation due to FET stacking, good linearity, and high frequency operation (i.e., radio frequencies up to and exceeding 300 GHz). Monolithic IC implementation is particularly useful since parasitic capacitances generally can be kept low (or at a minimum, kept uniform across all units, permitting them to be compensated) by careful design.

Voltage levels may be adjusted, and/or voltage and/or logic signal polarities reversed, depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functionality without significantly altering the functionality of the disclosed circuits.

Circuits and devices in accordance with the present invention may be used alone or in combination with other components, circuits, and devices. Embodiments of the present invention may be fabricated as integrated circuits (ICs), which may be encased in IC packages and/or in modules for ease of handling, manufacture, and/or improved performance. In particular, IC embodiments of this invention are often used in modules in which one or more of such ICs are combined with other circuit blocks (e.g., filters, amplifiers, passive components, and possibly additional ICs) into one package. The ICs and/or modules are then typically combined with other components, often on a printed circuit board, to form part of an end product such as a cellular telephone, laptop computer, or electronic tablet, or to form a higher-level module which may be used in a wide variety of products, such as vehicles, test equipment, medical devices, etc. Through various configurations of modules and assemblies, such ICs typically enable a mode of communication, often wireless communication.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, and/or parallel fashion.

It is to be understood that the foregoing description is intended to illustrate and not to limit the scope of the invention, which is defined by the scope of the following claims, and that other embodiments are within the scope of the claims. In particular, the scope of the invention includes any and all feasible combinations of one or more of the processes, machines, manufactures, or compositions of matter set forth in the claims below. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A radio frequency (RF) switch, comprising:
a first single-pole single-throw (SPST) switch element coupled between a common port of the RF switch and a first port of the RF switch, the first SPST switch element comprising:
a first series transistor coupled between the common port and the first port;
a first shunting transistor coupled between the first port and a reference ground; and
a first inductor coupled between the common port and the first port,
wherein
an inductance of the first inductor is selected so that in combination with an off capacitance of the first series transistor form a first resonant circuit that resonates at a first frequency of interest that is outside a frequency band of operation of the first SPST switch, and
the first frequency of interest is a harmonic of a center frequency of the frequency band of operation of the first SPST switch.

2. The radio frequency (RF) switch of claim 1, wherein:
source and drain nodes of the first series transistor are coupled between the common port and the first port, and
source and drain nodes of the first shunting transistor are coupled between the first port and the reference ground.

3. The radio frequency (RF) switch of claim 1, wherein:
the first SPST switch element further comprises a transistor switch in series connection with the first inductor.

4. The radio frequency (RF) switch of claim 3, wherein:
during an OFF state of the first SPST switch element, the transistor switch is ON, and
during an ON state of the first SPST switch element, the transistor switch is OFF.

5. The radio frequency (RF) switch of claim 3, wherein:
a size of the transistor switch is about $\frac{1}{10}$ a size of the first series or shunting transistor.

6. The radio frequency (RF) switch of claim 3, wherein:
a ratio of a size of the transistor switch to a size of the first series or shunting transistor is in a range from $\frac{1}{1000}$ to $\frac{1}{5}$.

7. The radio frequency (RF) switch of claim 1, further comprising:
a second single-pole single-throw (SPST) switch element coupled between the common port of the RF switch and a second port of the RF switch, the second SPST switch element comprising:
a second series transistor coupled between the common port and the second port; and
a second shunting transistor coupled between the second port and the reference ground,
wherein the second SPST switch is configured for operation at a second frequency band of operation having a second center frequency, and
the second frequency band of operation includes the first frequency of interest.

8. The radio frequency (RF) switch of claim 7, wherein:
the second single-pole single-throw (SPST) switch element further comprises a second inductor coupled between the common port and the second port, and
an inductance of the second inductor is selected so that in combination with an off capacitance of the second series transistor form a second resonant circuit that resonates at a second frequency of interest.

9. The radio frequency (RF) switch of claim 8, wherein:
the first frequency of interest is equal to the second frequency of interest.

10. The radio frequency (RF) switch of claim 8, wherein:
the first frequency of interest is different from the second frequency of interest.

11. The radio frequency (RF) switch of claim 8, wherein:
the second frequency of interest is equal to a center frequency or a harmonic of the center frequency of a first RF channel processed through the first SPST switch element.

12. The radio frequency (RF) switch of claim 7, wherein:
the first SPST switch element further comprises a first transistor switch in series connection with the first inductor, and
the second SPST switch element further comprises a second transistor switch in series connection with the second inductor.

13. The radio frequency (RF) switch of claim 1, wherein:
the first series transistor or the first shunting transistor is a metal-oxide-semiconductor (MOS) field effect transistor (FET).

14. The radio frequency (RF) switch of claim 13, wherein:
said MOSFET is fabricated using one of: a) silicon-on-insulator (SOI) technology, or b) silicon-on-sapphire technology (SOS).

15. A radio frequency (RF) frontend system comprising:
the RF switch of claim 8; and
an antenna coupled to the common port of the RF switch,
wherein the RF frontend system is configured to receive or transmit through the antenna:
   a first RF signal coupled to the first port of the RF switch, and
   a second RF signal coupled to the second port of the RF switch.

16. The radio frequency (RF) frontend system of claim 15, wherein:
   an inductance of the second inductor is selected such that during processing of the first RF signal, an impedance matching to the antenna is provided by an OFF-state impedance of the second SPST switch element, and
   an inductance of the first inductor is selected such that during processing of the second RF signal, an impedance matching to the antenna is provided by an OFF-state impedance of the first SPST switch element.

17. A method for improving isolation performance of a radio frequency (RF) switch at a frequency of interest, the method comprising:
   realizing the RF switch via at least one single-pole single-throw (SPST) switch comprising:
      a) a first series transistor coupled between a common port and a first port of the RF switch; and
      b) a first shunting transistor coupled between the first port and a reference ground;
   based on the realizing, determining an off capacitance of the first series transistor;
   based on the determining, selecting an inductor having an inductance that when combined in parallel with the off capacitance, realizes a resonant circuit that resonates at the frequency of interest; and
   based on the selecting, coupling the inductor between the common port and the first port, thereby improving isolation performance of the RF switch at the frequency of interest
wherein
   the frequency of interest is outside a frequency band of operation of the at least one SPST switch, and
   the first frequency of interest is a harmonic of a center frequency of the frequency band of operation of the first SPST switch.

* * * * *